(12) United States Patent
Haiberger et al.

(10) Patent No.: US 10,115,713 B2
(45) Date of Patent: Oct. 30, 2018

(54) OPTOELECTRONIC ASSEMBLY AND METHOD OF OPERATING AN OPTOELECTRONIC ASSEMBLY

(71) Applicant: OSRAM Opto Semiconductors GmbH, Regensburg (DE)

(72) Inventors: Luca Haiberger, Regensburg (DE); Markus Wicke, Regensburg (DE); Yanqi Wang, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/430,625

(22) PCT Filed: Sep. 26, 2013

(86) PCT No.: PCT/EP2013/070034
§ 371 (c)(1),
(2) Date: Mar. 24, 2015

(87) PCT Pub. No.: WO2014/049033
PCT Pub. Date: Apr. 3, 2014

(65) Prior Publication Data
US 2015/0236000 A1 Aug. 20, 2015

(30) Foreign Application Priority Data
Sep. 28, 2012 (DE) .......... 10 2012 109 216

(51) Int. Cl.
*H01L 33/00* (2010.01)
*H01L 31/10* (2006.01)
(Continued)

(52) U.S. Cl.
CPC .......... *H01L 25/167* (2013.01); *H01L 25/165* (2013.01); *H01L 31/02327* (2013.01);
(Continued)

(58) Field of Classification Search
CPC ................. H01L 25/167; H01L 25/165; H01L 31/02327; H01L 31/145; H05B 33/0854; H05B 33/0896
See application file for complete search history.

(56) References Cited

U.S. PATENT DOCUMENTS

| 4,810,937 | A | 3/1989 | Havel |
| 6,375,340 | B1 | 4/2002 | Biebl et al. |

(Continued)

FOREIGN PATENT DOCUMENTS

| DE | 693 05 935 T2 | 3/1997 |
| DE | 199 31 689 | 1/2001 |

(Continued)

OTHER PUBLICATIONS

Scott Segal, EIC 2800 Search Report, STIC.*

*Primary Examiner* — Dedei K Hammond
*Assistant Examiner* — Raymond R Chai
(74) *Attorney, Agent, or Firm* — DLA Piper LLP (US)

(57) ABSTRACT

An optoelectronic assembly includes at least one first component that emits first electromagnetic radiation and at least one first photosensitive component that controls the first component. The first photosensitive component connects in parallel to the first component and has a first radiation-sensitive region in a beam path of the first electromagnetic radiation.

3 Claims, 6 Drawing Sheets

(51) Int. Cl.
*H01L 25/16* (2006.01)
*H01L 31/14* (2006.01)
*H01L 31/0232* (2014.01)
*H05B 33/08* (2006.01)

(52) U.S. Cl.
CPC ....... *H01L 31/145* (2013.01); *H05B 33/0854* (2013.01); *H05B 33/0896* (2013.01)

(56) References Cited

U.S. PATENT DOCUMENTS

| | | | |
|---|---|---|---|
| 2002/0130326 A1* | 9/2002 | Tamura | F21K 9/00 257/79 |
| 2003/0166773 A1* | 9/2003 | Chen | C08F 214/225 525/70 |
| 2006/0012986 A1* | 1/2006 | Mazzochette | F21K 9/00 362/227 |
| 2006/0092210 A1* | 5/2006 | Maniam | G07D 7/20 347/19 |
| 2007/0034775 A1 | 2/2007 | Cheng et al. | |
| 2007/0278500 A1* | 12/2007 | Lin | H01L 25/167 257/81 |
| 2010/0294961 A1* | 11/2010 | Ashdown | G01J 1/04 250/552 |
| 2011/0291129 A1* | 12/2011 | Wirth | H05B 33/0857 257/89 |
| 2012/0032600 A1* | 2/2012 | Edwards | H05B 33/0869 315/151 |
| 2014/0228914 A1* | 8/2014 | van de Ven | A61N 5/0618 607/88 |

FOREIGN PATENT DOCUMENTS

| | | | |
|---|---|---|---|
| DE | 102 57 184 A1 | | 7/2003 |
| JP | 62-86775 | | 4/1987 |
| JP | 6-61526 | | 3/1994 |
| JP | H0061526 | * | 3/1994 |
| JP | H0661526 | * | 3/1994 |

* cited by examiner

OPTOELECTRONIC ASSEMBLY AND METHOD OF OPERATING AN OPTOELECTRONIC ASSEMBLY

TECHNICAL FIELD

This disclosure relates to an optoelectronic assembly and to a method of operating an optoelectronic assembly.

BACKGROUND

Components emitting electromagnetic radiation such as LEDs or OLEDs or lasers generate electromagnetic radiation having differing beam strengths and/or in different wavelength ranges, e.g., light of different colors, depending on their design. As a result, for different applications specific components emitting electromagnetic radiation may be chosen, the light intensity and/or the wavelength range of which, e.g., the color, is suitable for the respective field of application.

With increasing operating time, the components emitting electromagnetic radiation may, however, deteriorate, e.g., resulting in a decrease of efficiency and/or of light intensity and thus of the perceived brightness and/or resulting in a shift of the wavelength range of the generated electromagnetic radiation and thus of the perceived color.

Alternatively or additionally, the components emitting electromagnetic radiation may be temperature-sensitive so that, e.g., an increase in temperature may result in a decrease of efficiency and/or of illumination or, respectively, light intensity and thus of the perceived brightness, and/or may result in a shift of the wavelength range of the generated electromagnetic radiation and thus of the perceived color.

Those modifications of the electromagnetic radiation may, e.g., be compensated for by operating the corresponding components generating the electromagnetic radiation by an open control loop. Such an open control loop may, e.g., comprise a photo-sensor detecting the electro-magnetic radiation. Depending on the detected electromagnetic radiation, an energy supply, e.g., a voltage and/or current supply, to the corresponding component may be set such that the modifications caused by deterioration or temperature are completely or partially compensated for. Such open control loops, however, are relatively expensive and complex in manufacture.

SUMMARY

We provide an optoelectronic assembly including at least one first component that emits a first electromagnetic radiation, and a first photosensitive component that controls the first component electrically connected in parallel with the first component and comprises a first radiation-sensitive region arranged in a beam path of the first electromagnetic radiation.

We also provide an optoelectronic assembly including at least one first component that emits a first electromagnetic radiation, a first photosensitive component that controls the first component electrically connected in parallel with the first component and comprising a first radiation-sensitive region arranged in a beam path of the first electromagnetic radiation, an electric resistance of the first photosensitive component depending on the electromagnetic radiation incident on the first radiation-sensitive region, wherein, when the optoelectronic assembly is operated, the first photosensitive component is at first not irradiated and has a very high electric resistance, resulting in an electric current which flows through the optoelectronic assembly essentially flowing via the first component as an active current, the first component emitting the first electromagnetic radiation in reaction to the active current, wherein at least a portion of the first electromagnetic radiation strikes the first radiation-sensitive region of the first photosensitive component, resulting in a decrease of the electric resistance of the first photosensitive component, reduction of the electric resistance of the first photosensitive component results in a part of the total current which flows through the optoelectronic assembly flowing via the first photosensitive component as a reservoir current so that less active current flows via the first component, the alternating behavior may even out after a short period of time so that a constant active current flows via the first component and a constant reservoir current flows via the first photosensitive component, provided that the total current is essentially constant, and the constant active current flowing via the first component results in the electromagnetic radiation having an essentially constant beam strength and/or remaining within a constant wavelength range.

We further provide a method of operating an optoelectronic assembly wherein an electric voltage is applied to a first component that emits electromagnetic radiation and to a first photosensitive component connected in parallel with the first component, wherein an active current caused by the applied voltage is generated by the first component and a reservoir current caused by the applied voltage is generated by the first photosensitive component, depending on an electric resistance of the first component and of the photosensitive component, the electromagnetic radiation is generated by the first component depending on the active current, depending on the electromagnetic radiation, the electric resistance of the first photosensitive component is reduced, and depending on the reduction of the electric resistance of the first photosensitive component, the active current is reduced and the reservoir current is increased.

DETAILED DESCRIPTION

We provide an optoelectronic assembly such that electromagnetic radiation which is subject to no or at least only to little modification during a long operating time of the optoelectronic assembly and/or over a large temperature range, and/or which is configured simply and/or inexpensively.

We also provide a method of operating an optoelectronic assembly that operates the optoelectronic assembly such that during a long operating time and/or with different temperature in an inexpensive manner the electromagnetic radiation is subject to no or at least only to little modification.

We further provide an optoelectronic assembly comprising at least a first component that emits a first electromagnetic radiation and a first photosensitive component that controls the first component. The first photosensitive component electrically connects in parallel to the first component. The first photosensitive component comprises a radiation-sensitive region arranged in a beam path of the first electromagnetic radiation.

An electric resistance of the first photosensitive component depends on the electromagnetic radiation incident on the first radiation-sensitive region. The first photosensitive component may also be referred to as a first photo-resistance. If the optoelectronic assembly is operated, the first photosensitive component is at first not irradiated and thus has a very high electric resistance. This results in an electric current, e.g., a total current, which flows through the optoelectronic assembly essentially flowing via the first component as an active current, the first component emitting the first electromagnetic radiation in reaction to the active current. At least a portion of the first electromagnetic radiation strikes the first radiation-sensitive region of the first photosensitive component, resulting in a decrease of the electric resistance of the first photosensitive component. Reduction of the electric resistance of the first photosensitive component results in a part of the total current which flows through the optoelectronic assembly now flowing via the first photosensitive component as a reservoir current so that less active current flows via the first component. This alternating behavior may even out after a short period of time, e.g., after a few milliseconds so that a constant active current flows via the first component and a constant reservoir current flows via the first photosensitive component, provided that the total current is essentially constant. The constant active current flowing via the first component results in the electromagnetic radiation having an essentially constant beam strength and/or remaining within a constant wavelength range.

After a long period of operation, the first component may deteriorate and/or the first component may be subject to a temperature change such that, with a constant active current, it generates electromagnetic radiation with a lower light intensity and/or illumination or in a shifted wavelength range. This may result in the electric resistance of the first photosensitive component increasing, which again results in a major part of the total current flowing via the first component as active current. The increased active current flowing via the first component again results in an increase of illumination and/or light intensity and/or in a re-shift of the color-locus range and thus in a compensation of the modifications caused by deterioration or, respectively, temperature.

Thus, the photosensitive component connected in parallel with the first component results in an automatic control, e.g., in an internal automatic control of the optoelectronic assembly without the necessity of providing an associated open loop control. In other words, the first photosensitive component connected in parallel with the first component is an automatic control of the first component and/or an internal automatic control of the electronic assembly. The first photosensitive component may be manufactured simply and inexpensively and it may easily be coupled into the optoelectronic assembly comprising the first component. The optoelectronic assembly thus provides an electromagnetic radiation exhibiting no or at least only little change of the electromagnetic radiation during a particularly long operation period and/or in spite of temperature changes.

The first component that emits a first electromagnetic radiation may, e.g., be a semiconductor component emitting electromagnetic radiation such as an LED or an OLED. The first photosensitive component may, e.g., be a photo-resistance and/or a photo-transistor and/or a photo-diode and/or other types of semiconductor component. The photosensitive component may, e.g., comprise a cadmium-sulphide or cadmium-selenide layer on a substrate, e.g., a ceramic substrate, or a different semiconductor material such as Si, GaN, GaAs or the like. In addition, the photosensitive component may be coated with synthetic resin or be embedded therein or comprise a glass cover.

The optoelectronic assembly may comprise at least a second component that emits a second electromagnetic radiation. The first radiation-sensitive region of the first photosensitive component is not arranged in a beam path of the second electromagnetic radiation. For example, the first radiation-sensitive region of the first photosensitive component is arranged outside of the beam path of the second electromagnetic radiation. In other words, the second component and the first photosensitive component are arranged such that the second electromagnetic radiation does not affect the first photosensitive component.

For example, the second component may generate the second electromagnetic radiation in a different wavelength range than the first electromagnetic radiation generated by the first component. For example, the first component may generate light of a different color than the second component. For example, the two components may both be arranged in the same optoelectronic assembly so that the first and the second electromagnetic radiation mix to specifically generate electromagnetic radiation of a predetermined color by a color mixture.

Components that emit electromagnetic radiation of differing wavelength ranges may accordingly deteriorate at different speeds and/or respond differently to temperature changes. For example, the first component may deteriorate relatively quickly and/or respond relatively strongly to temperature changes and the second component may, e.g., deteriorate relatively slowly and/or respond relatively little to temperature changes. Coupling the first photosensitive component to the first component may then not only contribute to generating the first electromagnetic radiation without or at least with relatively little changes due to deterioration and/or temperature changes, but also to generating the electromagnetic radiation which is generated by mixing the first and second electromagnetic radiation without or with at least relatively small changes due to deterioration and/or temperature changes.

The optoelectronic assembly may comprise a second photosensitive component electrically connected in parallel to the second component and comprises a second radiation-sensitive region. The second radiation-sensitive region is arranged within a beam path of the second electromagnetic radiation. For example, the second component may be configured according to the first component and/or the second photosensitive component may be configured according to the first photosensitive component. In this case, the first photosensitive component serves to control the first component and the second photosensitive component serves to control the second component. The second photosensitive component may, e.g., be configured as a second photo-resistance and/or be referred to as a second photo-resistance.

Alternatively, the two components may differ with regard to their behavior during deterioration and/or a temperature change and the first or, respectively, the second photosensitive component may be adjusted according to this differing behavior. For example, the first component may deteriorate relatively quickly and/or respond relatively strongly to a temperature change and the second component may deteriorate relatively slowly and/or respond relatively little to a temperature change, and the photosensitive components may, e.g., be chosen such that the first reservoir current for the first component and the second reservoir current for the second component are adjusted to the respective modification of the component.

The optoelectronic assembly may comprise at least the second component that emits a second electromagnetic radiation and the second photosensitive component. The second photosensitive component electrically connects in parallel to the second component and comprises a second radiation-sensitive region arranged in a beam path of the second electromagnetic radiation. In these examples, the first photosensitive component may be arranged with regard to the second component and/or the second photosensitive component may be arranged with regard to the first component, e.g., such that the second electromagnetic radiation is incident on the first radiation-sensitive region of the first photosensitive component or, respectively, the first electromagnetic radiation is incident on the second radiation-sensitive region of the second photosensitive component. However, the photosensitive components may, e.g., be chosen such that the first photosensitive component essentially only responds to the first electromagnetic radiation and the second photosensitive component essentially only responds to the second electromagnetic radiation. This may, e.g., be realized by the first electromagnetic radiation comprising a different wavelength range than the second electromagnetic radiation and by the first photosensitive component being sensitive essentially in the wavelength range of the first electromagnetic radiation and the second photosensitive component being sensitive essentially in the wavelength range of the second electromagnetic radiation.

The first radiation-sensitive region of the first photosensitive component may be arranged in a beam path of the second electromagnetic radiation and in the corresponding beam path of the second electromagnetic radiation, a first beam filter may be arranged between the second component and the first photosensitive component, the beam filter blocking the second electromagnetic radiation. As an alternative or in addition, e.g., the first photosensitive component may be adapted to the first electromagnetic radiation, which may, e.g., be achieved by suitably choosing the material of the first photosensitive component. This may contribute to the second electromagnetic radiation having no or only a negligible impact on the first photosensitive component. The first beam filter may, e.g., be a wavelength-selective filter which blocks at least the second electromagnetic radiation and lets the first electromagnetic radiation pass.

The second radiation-sensitive region of the second photosensitive component may be arranged in a beam path of the first electromagnetic radiation. In the corresponding beam path of the first electromagnetic radiation, a second beam filter is arranged between the first component and the second photosensitive component, the second beam filter blocking the first electromagnetic radiation. As an alternative or in addition, e.g., the second photosensitive component may be adapted to the second electromagnetic radiation which may, e.g., be achieved by suitably choosing the material of the second photosensitive component. The second beam filter may, e.g., be configured according to the first beam filter, wherein in contrast thereto the second beam filter blocks the first electromagnetic radiation and lets the second electromagnetic radiation pass.

The first beam filter may be arranged on the first radiation-sensitive region and/or the second beam filter may be arranged on the second radiation-sensitive region. For example, at least one of the beam filters may be formed of a coating on the radiation-sensitive region of the corresponding photosensitive component. The radiation-sensitive region may, e.g., extend over one or several surfaces of the corresponding photosensitive region. For example, the beam filter may extend over one or several, e.g., over all radiation-sensitive regions of the corresponding photosensitive component. For example, the photosensitive component may be encapsulated by the beam-filter material.

The optoelectronic assembly may comprise a first carrier on which the first component and the first photosensitive component are arranged. Alternatively or additionally, the optoelectronic assembly comprises a first housing into which the first component and the first photosensitive component and, as the case may be, the first carrier are arranged. For example, the first carrier may be a leadframe, a leadframe section of the leadframe or a printed circuit board. The housing may. e.g. be configured by a mold compound. The optoelectronic assembly may in this context, e.g., be referred to as LED package.

The second component may be arranged on the first carrier and/or in the first housing. In other words, both components are arranged on one carrier, i.e., the first carrier, and/or in one housing, i.e., the first housing. This may contribute to configuring the optoelectronic assembly with two components to generate the electromagnetic radiation in a compact manner.

The second photosensitive component may be arranged on the first carrier and/or in the first housing. In a simple manner, this contributes to controlling the second component in the first housing and/or on the first carrier.

The optoelectronic assembly may comprise a second carrier on which the second component and the second photosensitive component are arranged. Alternatively or additionally, the optoelectronic assembly comprises a second housing in which the second component and the second photosensitive component are arranged. This may, e.g., contribute to prevent the second electromagnetic radiation from influencing the first photosensitive component and/or the first electromagnetic radiation from influencing the second photosensitive component. For example, the housings are configured such that the first and/or the second housing prevents the first electromagnetic radiation from impinging on the second photosensitive component and/or the second electromagnetic radiation from striking on the first photosensitive component.

The optoelectronic assembly may comprise a semiconductor chip comprising the first component and the first photosensitive component. In other words, the first component and the first photosensitive component are integrated in one single semiconductor chip. The semiconductor chip may, e.g., comprise an LED chip on which the material of the photosensitive component has been deposited. In other words, the first component and the first photosensitive component may be integrated in a die.

A method of operating an optoelectronic assembly is provided. In the method, an electric voltage is applied to the first component that emits the first electromagnetic radiation and to the first photosensitive component connected in parallel to the first component. An active current caused by the applied voltage and flowing through the first component and a reservoir current caused by the applied voltage and flowing through the first photosensitive component depend on an electric resistance of the first component and on an electric resistance of the first photosensitive component. By the first component, the first electromagnetic radiation is generated depending on the active current. Depending on the first electromagnetic radiation, the electric resistance of the first photosensitive component is reduced. Depending on the reduction of the electric resistance of the first photosensitive component, the active current is reduced and the reservoir current is increased.

The electric resistance of the first photosensitive component may be increased while efficiency of the first component decreases, whereby the reservoir current is reduced and the active current is increased. This results in a reinforcement of the active current and thus in an increased generation of the first electromagnetic radiation. This reinforcement counteracts the decrease in efficiency of the first component. The efficiency may, e.g., decrease due to deterioration and/or a change in temperature.

The first component may be controlled by the first photosensitive component electrically connected in parallel thereto.

Examples are depicted in the drawings and will be explained in detail in the following.

In the following detailed description, reference is made to the accompanying drawings which are part of this description and in which, for the purpose of illustration, specific examples in which our assemblies and methods may be realized are shown. In this context, directional terminology such as "top," "bottom," "front," "back" and the like is used with reference to the orientation of the described drawing(s). As components of an example may be aligned in a number of different orientations, the directional terminology serves the purpose of clarity and is not limiting. Of course, different examples may be used and structural or logical modifications may be carried out without exceeding the protective scope of this disclosure. Of course, the features of the examples described herein may be combined with one another if no specification to the contrary is given. The following detailed description is thus not to be considered limiting, and the protective scope of our assemblies and methods is defined by the appended claims.

Within the framework of this description, terms such as "connected," "contacted" and "coupled" are used to describe a direct as well as indirect connection, a direct or indirect contact as well as a direct or indirect coupling. In the drawings, identical or similar elements are provided with identical reference numerals, if suitable.

In various examples, a component emitting electromagnetic radiation may be a semiconductor component emitting electromagnetic radiation and/or a diode emitting electromagnetic radiation or a diode emitting organic electromagnetic radiation. The radiation may, e.g., be light in the visible range, ultraviolet light and/or infrared light. In this context, the component emitting electromagnetic radiation may, e.g., be configured as a light-emitting diode (LED), as an organic-light-emitting diode (OLED), as a light-emitting transistor or as an organic-light-emitting transistor. In various examples, the light-emitting component may be part of an integrated circuit. Moreover, a plurality of light-emitting components may be provided which is, e.g., accommodated in a shared housing.

Figure 1:
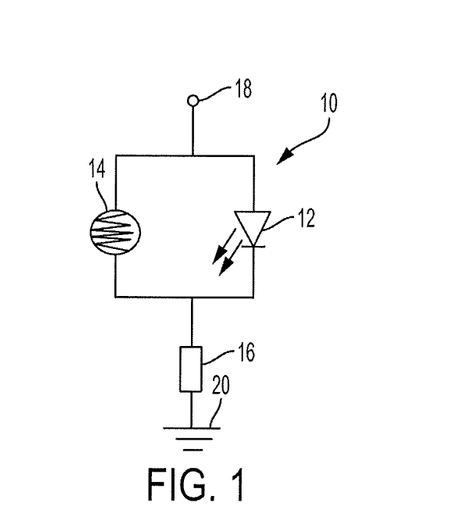
FIG. 1 shows a functional principle of an example of an electronic assembly.

FIG. 1 shows a functional principle of an example of an electronic assembly 10. The electronic assembly 10 comprises at least one first component 12 emitting a first electromagnetic radiation, and at least one first photosensitive component 14. The first component 12 may also be referred to as a first component 12 emitting electromagnetic radiation. The first component 12 and the first photosensitive component 14 are electrically connected in parallel. The first component 12 and the first photosensitive component 14 are arranged such that with regard to one another at least a portion of the first electromagnetic radiation strikes the first photosensitive component 14, e.g., a first radiation-sensitive region of the first photosensitive component 14.

Moreover, e.g., a first resistance 16 may be connected in series with the first photosensitive component 14 and the first component 12. The electronic assembly 10 connects to an energy supply, e.g., to a voltage and/or current source which may, e.g., comprise a first electrical contact 18 and/or a ground contact 20.

The first photosensitive component 14 may, e.g., be a photo-transistor or a photo-diode and/or comprise a semiconductor material. The photosensitive component 14 may, e.g., comprise a cadmium-sulfide or cadmium-selenide layer on a substrate, e.g., a ceramic substrate. Moreover, the first photosensitive component 14 may be coated with synthetic resin or be embedded therein or comprise a glass cover. Moreover, the photosensitive component may be completely or partially coated with a beam-filter material, as explained in the following.

An electric resistance of the photosensitive component 14 depends on the electromagnetic radiation striking on the first radiation-sensitive region of the first photosensitive component 14, e.g., of the first electromagnetic radiation. As illumination or light intensity of the first electromagnetic radiation increase, the electric resistance of the first photosensitive component 14 decreases. In the dark, the first photosensitive component may, e.g., be an insulator. For example, when switching on the electronic assembly 10, a total current flowing through the electronic assembly 10 may at first flow via the first component 12 almost exclusively as an active current. In response to the active current, the first component 12 generates the first electromagnetic radiation. The first electromagnetic radiation strikes the radiation-sensitive region of the first photosensitive component 14. Due to the first electromagnetic radiation, the electric resistance of the first photosensitive component 14 decreases. This results in a reservoir current flowing via the first photosensitive component 14 and accordingly less active current flowing via the first component 12, provided that the total current remains constant. This results in a decrease of the illumination and/or light intensity of the first electromagnetic radiation, which in turn results in an increase of the electric resistance of the first photosensitive component 14. These counteracting processes result in a constant current flow being provided via the first component 12 and a constant current flow being provided via the first photosensitive component 14 within a few ms. For example, for a total current of, e.g., 20 mA the active current may amount to, e.g., 19 mA and the reservoir current may be 1 mA after levelling out.

With increasing operating time, the first component 12 may, e.g., deteriorate and/or the temperature of the first component 12 may, e.g., increase, resulting in a lower illumination or, respectively, light intensity of the first electromagnetic radiation provided that the active current remains constant. The reduced illumination or, respectively, light intensity of the first electromagnetic radiation results in an increase of the electric resistance of the first photoelement 14, which in turn results in a reinforcement of the active current. The reinforced active current results in a stronger illumination or, respectively, light intensity of the first electromagnetic radiation, thus completely or at least partially compensating for the decrease of illumination or, respectively, light intensity due to deterioration and/or temperature.

Figure 2:
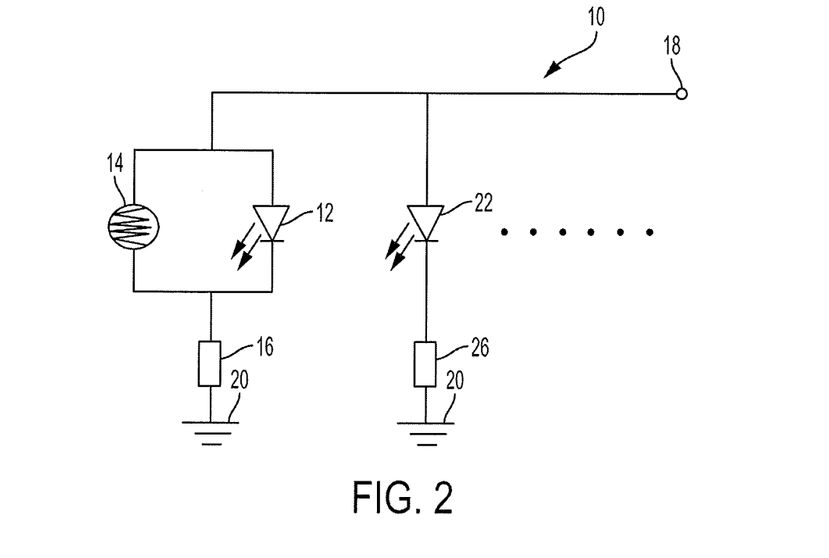
FIG. 2 depicts a functional principle of an example of an electronic assembly.

FIG. 2 schematically shows a functional principle of an example of an electronic assembly 10 which may, e.g., to a large extent correspond to the above-described electronic assembly 10. The electronic assembly 10 may, e.g., comprise a second component 22 generating second electromagnetic radiation. The second component 22 may, e.g., be a component emitting electromagnetic radiation. The second component 22 may, e.g., connect in series to a second electric resistance 26.

The second component 22 may, e.g., be configured essentially in accordance with the first component 12. For example, a wavelength range of the second electromagnetic radiation may correspond to a wavelength range of the first electromagnetic radiations. Alternatively, the wavelength range of the second electromagnetic radiation may differ from the wavelength range of the first electromagnetic radiation. For example, the first component 12 may generate red light and the second component 22 may generate green, blue or white light. The first and second electromagnetic radiation may, e.g., be superimposed on each other to generate light of a predetermined color.

For example, the second component 22 may deteriorate more slowly and/or respond less to a temperature change than the first component 12. With increasing operating time and thus increasing deterioration and/or in a temperature change, without the first photosensitive component 14, this would lead to a color shift of the superimposed electromagnetic radiation due to the change of the illumination and/or light intensity and/or the wavelength range of the first electromagnetic radiation. However, the first photosensitive component 14 prevents or reduces the change of illumination and/or light intensity and/or the shift of the wavelength ranges of the first electromagnetic radiation, thus preventing or, respectively, reducing the color change of the superimposed electromagnetic radiation.

The first and the second component 12, 22 may be arranged within the same housing or in different housings. The first photosensitive component 14 may, e.g., be configured such that it is only sensitive for the first electromagnetic radiation, but not for the second electromagnetic radiation. Alternatively or additionally, e.g., a first beam filter 15 may be arranged in the beam path between the first photosensitive component 14 and the second component 22. For example, the first beam filter 15 may be arranged on the radiation-sensitive region of the first photosensitive component 14. The first beam filter 15 may be deposited in the radiation-sensitive range of the first photosensitive component, e.g., in a deposition process. The material of the beam filter may, e.g., comprise one or more layers, e.g., alternating layers of $TiO_2$ and/or $SiO_2$. Alternatively, the housing(s) may be configured such that the second electromagnetic radiation does not strike onto the radiation-sensitive region of the first photosensitive component 14. Moreover, one, two or several further components emitting electromagnetic radiations with our without corresponding photosensitive components may be configured and/or arranged.

The electronic assembly 10 may, e.g., be an RGB-light source, e.g., an RGB-LED. The RGB-light source may comprise one, two or three photosensitive components, e.g., the first photosensitive component 14, which are assigned to the corresponding light-emitting components, e.g., to the first and the second component 12, 22 and by which an illumination and/or a color locus of the light generated by the RGB-light source remains predominantly constant over a long operating time and/or in case of temperature fluctuations, or at least only change minimally.

For example, a component emitting red light may be operated at 15 mA, a component emitting blue light may be operated at 15 mA and/or a component emitting green light may be operated at 20 mA. For example, red-emitting components have a higher temperature dependency than blue- or green-emitting components. For example, a semiconductor substrate based on indium-gallium-aluminium phosphite depends relatively strongly on temperature.

Figure 3:
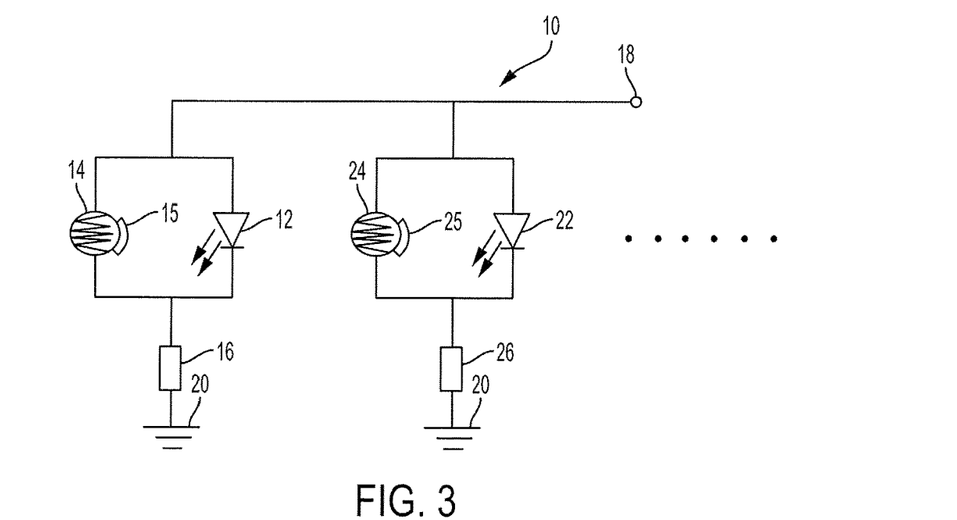
FIG. 3 depicts a functional principle of an example of an electronic assembly.

FIG. 3 schematically shows a functional principle of an example of an electronic assembly 10 which may, e.g., correspond to a large extent to one of the above-described electronic assemblies 10. The electronic assembly 10 may, e.g., comprise a second photosensitive component 24 electrically arranged in parallel to the second component 22. Basically, the functionality of the second photosensitive component 24 in connection with the second component 22 may correspond to the functionality of the first photosensitive component 14 in connection with the first component 12.

The second photosensitive component 24 may be adapted to the second electromagnetic radiation. For example, the second photosensitive component may be configured such that it is only sensitive to the second electromagnetic radiation and not to the first electromagnetic radiation. Alternatively or additionally, a second beam filter 25 may, e.g., be arranged in the beam path between the first component 12 and the second photosensitive component 14, the second beam filter blocking the first electromagnetic radiation and letting the second electromagnetic radiation pass. The second beam filter 25 may, e.g., be arranged on the second photosensitive region of the second photosensitive component 24. For example, the second photosensitive component 24 may be coated with the beam-filter material of the second beam filter 25. In other words, the second beam filter 25 may be configured as a filter layer on the second photosensitive component 24.

If the second component 22 shows a different deterioration behavior and/or responds differently to a change of temperature than the first component 12, e.g., the second photosensitive component 24 may be adapted accordingly. For example, the first component 12 may deteriorate relatively quickly and/or respond relatively strongly to temperature changes and the second component 22 may deteriorate relatively slowly and/or respond relatively little to temperature changes and the photosensitive components 14, 24 may, e.g., be chosen such that the first reservoir current for the first component 12 and the second reservoir current for the second component 22 is adapted to the respective change of the corresponding component 12, 22. The first component 12 and the first photosensitive component 14 as well as the second component 22 and the second photosensitive component 24 may, e.g., be arranged in a shared housing or in two separate housings. Moreover, the electronic assembly 10 may comprise further components emitting electromagnetic radiation and/or further photosensitive components assigned to the components.

Figure 4:
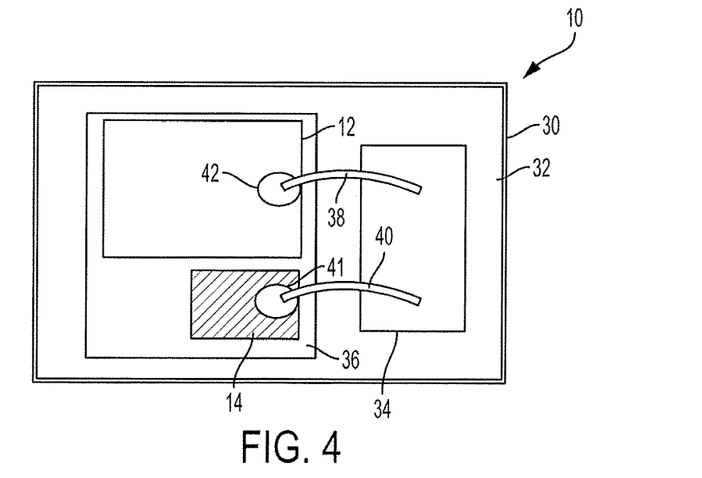
FIG. 4 shows a top view onto an example of an electronic assembly.

FIG. 4 shows a top view onto an example of an electronic assembly 10 which, e.g., with regard to its functionality may be configured according to the above-described electronic assemblies 10. The electronic assembly 10 comprises a first housing 30 which may, e.g., comprise a first carrier 32.

The first housing 30 may, e.g., comprise a mold compound or be formed thereof. For example, the first housing 30 may comprise epoxy, silicone and/or a hybrid, e.g., comprising epoxy or silicone. The first carrier 32 may, e.g., be referred to as a substrate. The first carrier 32 may, e.g., be an insulator, a semiconductor substrate comprising, e.g., germanium, silicon and/or sapphire, a ceramic substrate, a metal substrate, e.g., a leadframe, e.g., a quad flat no leads (QFN) leadframe and/or a printed circuit board. The leadframe may, e.g., comprise an electrically conductive material or be formed thereof. The electrically conductive material, e.g., comprises a metal such as copper, e.g., CuW or CuMo, copper alloys, brass, nickel and/or iron such as FeNi, and/or is formed thereof. The printed circuit board may, e.g., be a FR1, FR2, FR3, FR4, FR5, CEM1, CEM2, CEM3, CEM4 or CEM5 printed circuit board, e.g., a FR-4 printed circuit board having a through-contact. The thickness of the first housing 30 may, e.g., be 100 μm to 1 mm, 200 μm to 500 μm, e.g., 250 μm to 300 μm. The thickness of the first carrier may, e.g., be 100 μm to 500 μm, e.g., 150 μm to 300 μm.

On the first carrier 32, e.g., a first contact region 34 may be configured, e.g., as a layer on the first carrier 32 and/or comprise an electrically conductive material or be formed thereof. A second contact region 36 electrically insulated from the first contact region 34 may be configured on the carrier 32, being basically configured, e.g., in accordance with the first contact region 34. On the second contact region 36, a first component emitting electromagnetic radiation may be arranged, e.g., the above-described first component 12.

Furthermore, a first photosensitive component may, e.g., be arranged on the second contact region 36, e.g., the first photosensitive component 14 described above. The first component 12 may be electrically coupled to the first contact region 34, e.g., via a first contact pad 42 and a first bond wire 38. The first photosensitive component 14 may, e.g., be electrically coupled to the first contact region 34 via a second contact pad 44 and a second bond wire 40. A second electrical contact of the first component 12 may, e.g., be arranged at the bottom side (not shown in FIG. 4) of the first component 12 and/or be in physical contact with the second contact region 36. In the same manner, the side of the first photosensitive component 14 facing away from the second contact pad 44 may be in direct physical contact with the second contact region 36. Thus, the first component 12 and the first photosensitive component 14 electrically connect in parallel. The first contact region 34 may, e.g., be coupled to the first electrical contact 18 and/or the second contact region 36 may, e.g., be electrically coupled to the ground contact 20. The first contact region 34 and/or the second contact region 36 and/or the first photosensitive component 14 may, e.g., be deposited on the carrier 32 as a layer stack. Alternatively, the first photosensitive component 14 may be fixed to the second contact region 36 and/or electrically contacted thereto, e.g., by an adhesive, e.g., a solder or glue. The first component 12 may, e.g., be fixed and/or electrically contacted to the second contact region 36, e.g., by an adhesive, e.g., a solder or glue.

The first electromagnetic radiation may, e.g., directly reach the first photosensitive component 14. Alternatively or additionally, the first electromagnetic radiation may reach the first photosensitive component 14 by reflection, e.g., at the first housing 30.

Figure 5:
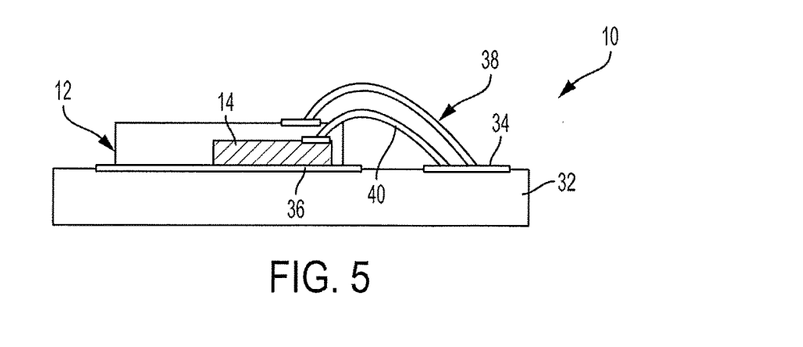
FIG. 5 shows a lateral view of the electronic assembly of FIG. 4.

FIG. 5 shows a lateral view of the electronic assembly 10 of FIG. 4. In FIG. 5, the first housing 30 is not shown for reasons of clear illustration.

Figure 6:
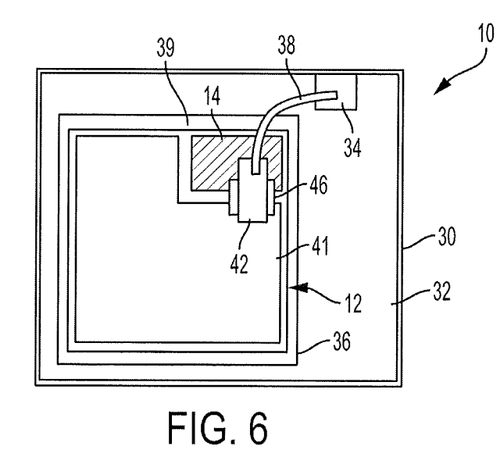
FIG. 6 depicts a top view onto an example of an electronic assembly.

FIG. 6 shows a top view onto an electronic assembly 10 which may, e.g., to a large extend correspond to one of the above-described electronic assemblies 10. For example, the electronic assembly 10 comprises a chip, preferably a semiconductor chip, which, e.g., comprises the first component 12 and the first photosensitive component 14. The first component 12, e.g., comprises a carrier layer 39 and a functional layer 41 deposited on the carrier layer 39. The carrier layer 39 may, e.g., comprise a substrate. The carrier layer 39 may, e.g., be configured in an electrically conductive manner.

The first photosensitive component 14 may, e.g., be arranged on the first component 12. A first electrical contact of the first component 12 and a first electrical contact of the first photosensitive component 14 may, e.g., be electrically coupled by the first contact pad 42. The first contact pad 42 may, e.g., be electrically coupled to the first contact region 34 by the first bond wire 38. A second electrical contact of the first component 12 may, e.g., be arranged at a bottom side (not shown in FIG. 6) of the first component 12 and physically coupled to the second contact region 36 in an electrical manner. A second electrical contact of the first photosensitive component 14 may, e.g., be physically connected to the electrically conductive carrier layer 39 of the first component 12 and moreover be electrically coupled to the second contact region 36.

Between the first component 12 and the first photosensitive component 14 and between the first contact pad 42 and the carrier layer 39, e.g., an insulator 46 may be formed.

Figure 7:
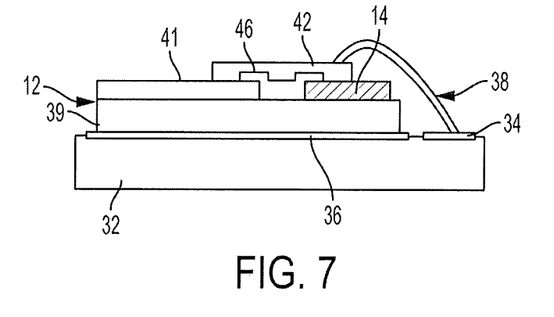
FIG. 7 shows a lateral view of the electronic assembly of FIG. 6.

FIG. 7 shows a lateral view of the electronic assembly 10 of FIG. 6. In FIG. 7, the first housing 30 is not shown for reasons of clearer illustration.

Figure 8:
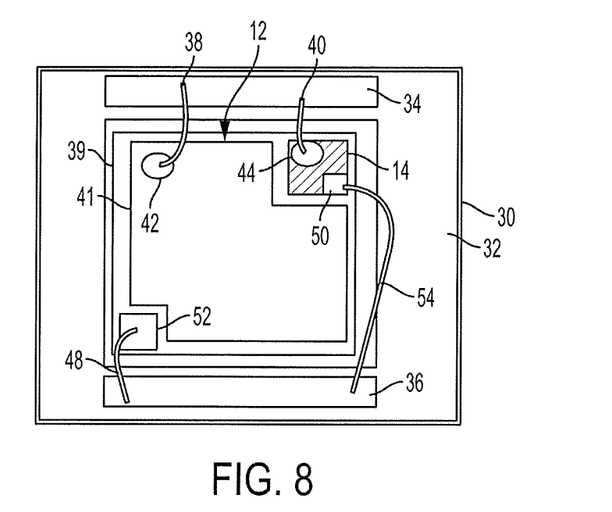
FIG. 8 is a top view onto an example of an electronic assembly.

FIG. 8 shows a top view onto an electronic assembly 10 which may, e.g., to a large extent correspond to one of the electronic assemblies 10 described above. For example, the electronic assembly 10 comprises a chip, e.g., a semiconductor chip, which, e.g., comprises the first component 12 and the first photosensitive component 14. The first component 12, e.g., comprises the carrier layer 39 and the functional layer 41 deposited on the carrier layer 39. The carrier layer 39 may, e.g., comprise the substrate. The carrier layer 39 may, e.g., be configured in an electrically insulating manner.

The first photosensitive component 14 may, e.g., be arranged on the first component 12. The first electrical contact of the first component 12 may be electrically coupled to the first contact region 34, e.g., by the first contact pad 42 and the first bond wire 38. The first electrical contact of the first photosensitive component 14 may be electrically coupled to the first contact region 34, e.g., by the second contact pad 44 and the second bond wire 40. The second electrical contact of the first photosensitive component 14 may be electrically coupled to the second contact region 36 by a third contact pad 50 and a third bond wire 54. The second electrical contact of the first component 12 may be electrically coupled to the second contact region 36 by a fourth contact pad 52 and a fourth bond wire 48. Thus, the first component 12 and the first photosensitive component 14 electrically connect in parallel.

Figure 9:
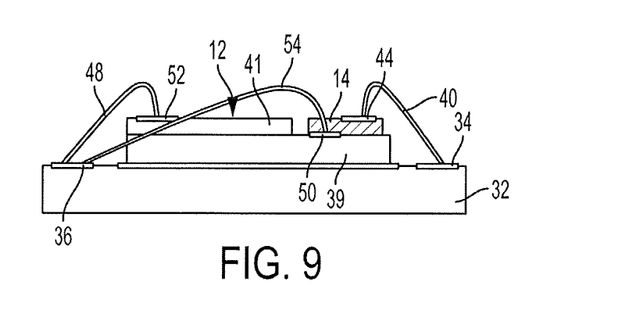
FIG. 9 depicts a lateral view of the electronic assembly of FIG. 8.

FIG. 9 shows a lateral view of the electronic assembly 10 of FIG. 8. In FIG. 9, the first housing 30 is not shown for reasons of clearer illustration.

Figure 10:
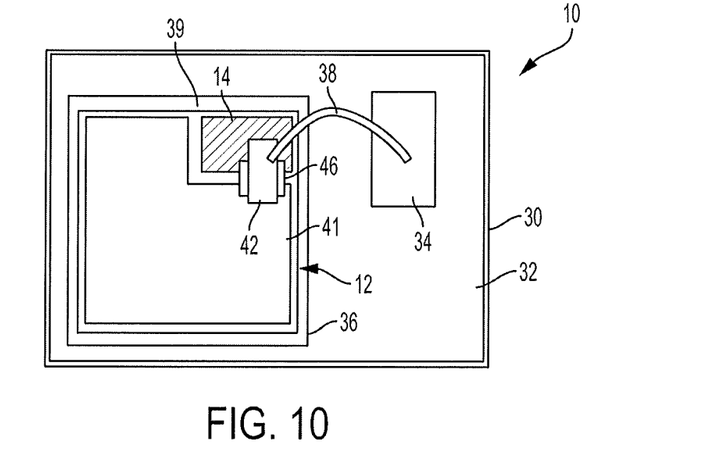
FIG. 10 shows a top view onto an example of an electronic assembly.

FIG. 10 shows a top view onto an electronic assembly 10 which may, e.g., to a large extent correspond to one of the above-described electronic assemblies 10, e.g., to a large extent to the electronic assembly 10 of FIG. 6.

Figure 11:
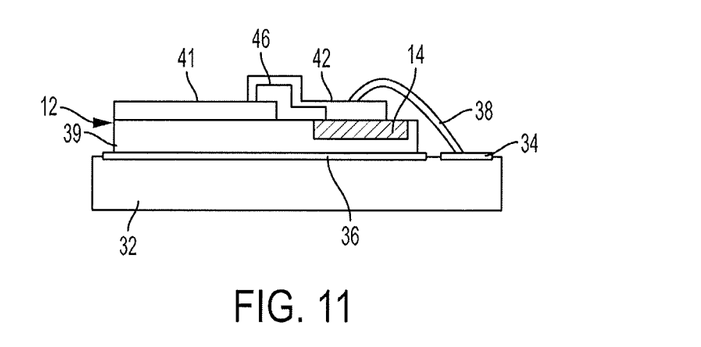
FIG. 11 shows a lateral view of the electronic assembly of FIG. 10.

FIG. 11 shows a lateral view of the electronic assembly 10 of FIG. 10. The first photosensitive component 14 may, e.g., be integrated in the first component 12 and/or in the carrier layer 39. In other words, e.g., the first photosensitive component 14 and the first component 12 and/or the carrier layer 39 may be integrated in a chip.

Figure 12:
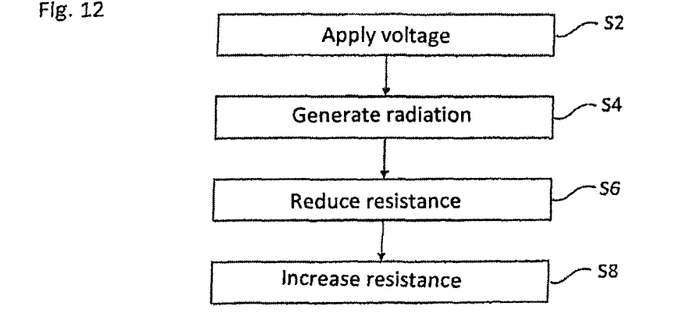
FIG. 12 depicts a flow chart of an example of a method of operating an electronic assembly.

FIG. 12 shows a flow chart of an example of a method of operating an electronic assembly, e.g., one of the electronic assemblies 10 described above.

In a step S2, e.g., a voltage is applied to the electronic assembly 10, e.g., the voltage is applied between the first electrical contact 18 and the ground contact 20.

In a step S4, electromagnetic radiation is generated, e.g., the first and/or second electromagnetic radiation, in response to an active current which, e.g., flows through the first component 12 or, respectively, the second component 22.

In a step S6, a reduction of the electric resistance of the first component 14 is achieved due to the first electromagnetic radiation and/or a reduction of the electric resistance of the second photosensitive component 24 is achieved due to the second electromagnetic radiation. After a short transient time, e.g., a constant active current may occur across the first or, respectively, second component 12, 22. The active current may, e.g., have a value of approximately 1 mA to about 10 A, e.g., about 10 mA to 1 A, e.g., about 100 mA to about 500 mA. In addition, a constant reservoir current may occur over the first or, respectively, second photosensitive component 14, 24, wherein the reservoir current may, e.g., have a value of about 0.1 mA to about 5 mA, e.g., about 0.5 mA to about 1.5 mA, e.g., about 1 mA.

In a step S8, e.g., the beam strengths of the first and/or second electromagnetic radiation may decrease and/or the wavelength range of the corresponding electromagnetic radiation may shift, e.g., due to increasing deterioration of the first or, respectively, second component 12, 22. For example, the efficiency of the first or, respectively, second component 12, 22 may decrease. The reduction of beam strength of the first and/or second electromagnetic radiation results in an increase of the electric resistance of the first and/or second photosensitive component 14, 24. The increase in electric resistance of the first and/or second photosensitive component 14, 24 results in a reduction of the reservoir current and in an increase of the active current, thereby completely or at least partially compensating for the decrease in efficiency of the first or, respectively, second component 12, 22. For example, 30% to 70%, e.g., about 50% of the decrease in efficiency may be compensated for.

Our assemblies and methods are not limited to the mentioned examples. The examples may, e.g., be combined with one another. For example, the functional principles schematically shown in FIGS. 1 to 3 may be transferred to the electronic assemblies of FIGS. 4 to 9. In addition to the components and photosensitive components shown in FIGS. 4 to 9, further photosensitive components and/or components corresponding to the functional principles shown in FIGS. 1 to 3 may, e.g., be arranged in the housing 30 and/or on the carrier 32 according to FIGS. 4 to 9. Alternatively or additionally, further housings or further carriers comprising the corresponding further components or, respectively, photosensitive components may be arranged.

The invention claimed is:

1. An optoelectronic assembly comprising:
a semiconductor chip comprising:
   at least one first component that emits a first electromagnetic radiation;
   a first photosensitive component that controls the first component electrically connected in parallel with the first component and comprises a first radiation-sensitive region arranged in a beam path of the first electromagnetic radiation, wherein the first photosensitive component connected in parallel with the first component is an automatic control of the first component such that the photosensitive component connected in parallel with the first component results in the automatic control without needing to provide an associated open loop control, and the first component and the first photosensitive component are integrated into the semiconductor chip;
   a first carrier on which the first component and the first photosensitive component are arranged, wherein on the first carrier a first contact region is configured, a second contact region electrically insulated from the first contact region is configured on the first carrier, the first component comprises a carrier layer and a functional layer deposited on the carrier layer, the carrier layer is configured in an electrically conductive manner, the first photosensitive component is arranged on the first component, a first electrical contact of the first component and a first electrical contact of the first photosensitive component are electrically coupled by a first contact pad, the first contact pad is electrically coupled to the first contact region by a first bond wire, a second electrical contact of the first component is arranged at a bottom side of the first component and is electrically and physically coupled to the second contact region, a second electrical contact of the first photosensitive component is physically connected to the electrically conductive carrier layer of the first component and is electrically coupled to the second contact region, and between the first component and the first photosensitive component and between the first contact pad and the carrier layer, an insulator is formed; and
   at least a second component that emits a second electromagnetic radiation and comprises a second photosensitive component electrically connected in parallel with the second component and a second radiation-sensitive region, wherein the second radiation-sensitive region is arranged in the beam path of the second electromagnetic radiation, the second radiation-sensitive region of the second photosensitive component is arranged in the beam path of the first electromagnetic radiation, a second beam filter is arranged in the beam path between the first component and the second photosensitive component, the second beam filter blocking the first electromagnetic radiation, and the second photosensitive component is coated with a beam-filter material of the second beam filter, and
   wherein the first radiation-sensitive region of the first photosensitive component is arranged outside of a beam path of the second electromagnetic radiation.

2. The optoelectronic assembly of claim 1, wherein a first beam filter is arranged in the beam path of the second electromagnetic radiation between the second component and the first photosensitive component, the first beam filter blocking the second electromagnetic radiation, and/or in which the first photosensitive component is adjusted to the first electromagnetic radiation.

3. The optoelectronic assembly according to claim 1, wherein the second radiation-sensitive region of the second photosensitive component is arranged in a beam path of the first electromagnetic radiation and a second beam filter is arranged in the beam path between the first component and the second photosensitive component, the second beam filter blocking the first electromagnetic radiation, and/or wherein the second photosensitive component is adjusted to the second electromagnetic radiation, wherein a first beam filter is arranged on the first radiation-sensitive region and/or in which the second beam filter is arranged on the second radiation-sensitive region.

* * * * *